United States Patent
Sundström et al.

(10) Patent No.: US 7,825,841 B2
(45) Date of Patent: Nov. 2, 2010

(54) ADJUSTING AN INPUT SIGNAL LEVEL OF A SIGMA-DELTA CONVERTER

(75) Inventors: Lars Sundström, Lund (SE); Stefan Nilsson, Malmö (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 91 days.

(21) Appl. No.: 12/096,604

(22) PCT Filed: Dec. 19, 2006

(86) PCT No.: PCT/EP2006/012220

§ 371 (c)(1),
(2), (4) Date: Oct. 17, 2008

(87) PCT Pub. No.: WO2007/071368

PCT Pub. Date: Jun. 28, 2007

(65) Prior Publication Data

US 2009/0219185 A1    Sep. 3, 2009

Related U.S. Application Data

(60) Provisional application No. 60/756,209, filed on Jan. 5, 2006.

(30) Foreign Application Priority Data

Dec. 22, 2005 (EP) .................. 05388113

(51) Int. Cl.
*H03M 3/00* (2006.01)

(52) U.S. Cl. ....................... 341/143; 375/345

(58) Field of Classification Search ......... 341/115–155; 375/345
See application file for complete search history.

(56) References Cited

U.S. PATENT DOCUMENTS 4,434,439 A    2/1984    Steckler et al.

(Continued)

FOREIGN PATENT DOCUMENTS

EP    1 569 346 A    8/2005

OTHER PUBLICATIONS

PCT International Search Report, mailed May 3, 2007, in connection with International Application No. PCT/EP2006/012220.

(Continued)

*Primary Examiner*—Lam T Mai
(74) *Attorney, Agent, or Firm*—Potomac Patent Group PLLC

(57) ABSTRACT

The invention relates to adjusting an input signal level of a Sigma-Delta converter. A control signal indicative of an input signal level to said Sigma-Delta converter is generated, and the input signal level to said Sigma-Delta converter is adjusted in dependence of said control signal. The control signal is generated as a signal indicating an operating condition of said Sigma-Delta converter. In this way, internal signals from the Sigma-Delta converter can be used to determine the state of the Sigma-Delta converter, i.e. whether it is operating within its operational input range or not, and whether it is close to the limits of the operational input range. This provides a simple, but accurate guidance of an automatic gain control upstream of the Sigma-Delta converter.

17 Claims, 12 Drawing Sheets

U.S. PATENT DOCUMENTS

| | | | |
|---|---|---|---|
| 5,012,244 A | | 4/1991 | Wellard et al. |
| 5,075,679 A | * | 12/1991 | Gazsi ........................ 341/143 |
| 6,498,819 B1 | * | 12/2002 | Martin ....................... 375/345 |
| 7,151,474 B2 | * | 12/2006 | Ortmanns et al. ........... 341/143 |
| 7,235,983 B2 | * | 6/2007 | O'Dowd et al. ............. 324/658 |
| 7,355,539 B2 | * | 4/2008 | Petersen et al. ............. 341/143 |
| 7,453,381 B2 | * | 11/2008 | Doerrer et al. .............. 341/143 |
| 7,567,192 B2 | * | 7/2009 | Colmer ....................... 341/143 |

OTHER PUBLICATIONS

PCT International Preliminary Report on Patentability, mailed Mar. 6, 2008, in connection with International Application No. PCT/EP2006/012220.

Fraser, N. A. et al: "Stability analysis of multiple-feedback oversampled / spl Sigma/-/sp Delta/ A/D" Proceedings of the 43rd IEEE Midwest Symposium on Circuits and Systems, Aug. 8-11, 2000, Piscataway, NJ, USA, IEEE, vol. 2, Aug. 8, 2000, pp. 676-679, XP01055896. ISBN: 0/7803-6475-9.

* cited by examiner

ADJUSTING AN INPUT SIGNAL LEVEL OF A SIGMA-DELTA CONVERTER

CROSS-REFERENCE TO RELATED APPLICATIONS

This application claims priority under 35 U.S.C. §119 to European Patent Application No. 05388113.2, filed Dec. 22, 2005, which is hereby incorporated herein by reference in its entirety. This application also claims the benefit of U.S. Provisional Application No. 60/756,209, filed Jan. 5, 2006, which is hereby incorporated herein by reference in its entirety.

TECHNICAL FIELD OF THE INVENTION

The invention relates to a method of adjusting an input signal level of a Sigma-Delta converter, comprising the steps of generating a control signal indicative of an input signal level to said Sigma-Delta converter; and adjusting the input signal level to said Sigma-Delta converter in dependence of said control signal. The invention further relates to an arrangement for performing analog-to-digital conversion, a device for generating a control signal indicative of an input signal level to a Sigma-Delta converter and to a corresponding computer program and computer readable medium.

DESCRIPTION OF RELATED ART

In recent years Sigma-Delta converters have been used successfully in analog-to-digital (AD) converters.

Conventional Nyquist-rate converters are built around a quantizer with a relatively fine resolution typically specified by the number of bits with which the signal is represented, e.g. 8 bits, 12 bits or 16 bits. For example, an AD converter that encodes an analog input to one of 256 discrete values has a resolution of 8 bits, since $2^8=256$.

However, due to the fine-resolution quantizer conventional converters are relatively complex in structure compared to a sigma delta converter. Further improvements of the conventional converter are cumbersome in that, on the one hand, further improvements of the fine resolution of the conventional converters will cause a dramatic increase in the complexity of the converter. Additionally, expensive matching or trimming of components is required. On the other hand, an increased sampling frequency will in general add extra costs to the manufacture of the converter. Conventional Nyquist converters sample an input signal at the Nyquist frequency; however, over-sampling of typically two to 16 times may be applied.

Sigma-Delta converters are less complex in their basic structure than the conventional converters. They are built around a quantizer with a relatively coarse resolution corresponding to typically 1 to 5 bits. This low resolution quantizer can be operated at a greater sampling frequency than the fine resolution quantizer, but at the cost of a larger quantization error; i.e. the difference between the input signal and the output signal.

To compensate for the larger quantization error, the Sigma-Delta converter is configured with a feedback loop that effectively results in quantization noise being shaped in the frequency domain to regions outside the frequency band of interest where the desired signal is located. This is one of the key features of Sigma-Delta converters and is broadly recognized and well understood by the persons skilled in the art of Sigma-Delta converter design. Further, the Sigma-Delta converter operates with relatively high over-sampling ratios of typically 10 to 1000. Generally, the Sigma-Delta converter provides lower distortion and lower cost when compared to conventional converters.

The continuous development of CMOS process technology that may be used in Sigma-Delta converters results in increased speed at the expense of a decrease in the maximum supply voltage possible. As far as AD converters are concerned, this means that Sigma-Delta converters have become a more viable choice over traditional Nyquist-rate (NR) converters. Like Nyquist-rate AD converters, the accuracy and resolution in Sigma-Delta converters may also be limited by a mismatch in the case of multi-bit Sigma-Delta converters, but not for 1-bit Sigma-Delta converters. A 1-bit Sigma-Delta converter is based on a 1-bit DA converter that is intrinsically linear and therefore is not subjected to mismatch errors.

Sigma-Delta converters can be time-discrete Sigma-Delta converters (TD-SDC) or time-continuous Sigma-Delta converters (TC-SDC). The latter provide inherent anti-aliasing, which is not the case for time-discrete Sigma-Delta converters. Furthermore, the theoretical limit on the clock frequency of a time-continuous Sigma-Delta converter is much higher than that of a time-discrete Sigma-Delta converter. The invention presented applies both to time-discrete Sigma-Delta converters and time-continuous Sigma-Delta converters.

In a Sigma-Delta converter an analog input signal is normally passed through a number of filters or integrators to the quantizer or AD converter. The order of the Sigma-Delta converter indicates the number of filters or integrators in the converter. The output of the converter is fed back through a DA converter to the inputs of the integrators.

A typical behaviour for Sigma-Delta converters is that the signal-to-noise ratio (SNR) for the output signal of the Sigma-Delta converter as a function of input RMS (root mean square) level of the total signal given in dB, where 0 dB input corresponds to unity magnitude, increases in a roughly linear fashion up to a certain point where it quickly drops to 0 dB. When the signal reaches levels close to or beyond the DA converter output level that is fed back to the first integrator in the Sigma-Delta converter, the Sigma-Delta converter cannot track the input signal anymore. This leads to the Sigma-Delta converter becoming overloaded and unstable and possibly the integrators will saturate as well (assumed to have a maximum allowed signal swing in a real implementation). In short, the Sigma-Delta converter will fail.

The input level, where this occurs, depends on the characteristics of the input signal. For example, the Sigma-Delta converter would be able to operate at higher input levels (several dB) if the input signal would be a single sinusoid or a single modulated carrier such as a WCDMA signal as the amplitude distribution for such a signal is rather compact with a small peak-to-average ratio (PAR) value. For an OFDM (orthogonal frequency division multiplex) signal an early drop at about −10 dB occurs, which is caused by the large peak-to-average ratio value for this type of signal. Every now and then large pulses appear in the OFDM signal that can be very much larger than the RMS level and they can extend beyond the stable input signal range of the Sigma-Delta converter, e.g. above input values of −10 dB.

In many radio receivers for various systems, including mobile phone systems, TV broadcast systems, etc., an automatic gain control (AGC) function is a necessity to cope with the large dynamic range of the signals received. Typically, the received signal strength is detected by use of e.g. an envelope or power detector somewhere along the analog part of the receiver chain. The signal strength could also be detected in the digital domain after analog-to-digital (AD) conversion of the signal. The signal strength or equivalent measure is then used to control the gain of an amplifier within the same receiver chain prior to a block such as a filter, down-conversion mixer, or ADC, whichever requires an adjusted level for optimal performance or avoidance of saturation. This use of AGCs in various receiver architectures for various systems and standards is well established and known.

Thus, if the range of input signal levels is larger than the level at which the Sigma-Delta converter is able to operate, under the assumption that a certain minimum signal-to-noise ratio is required, a variable-gain amplifier (VGA) controlled by an AGC function must be used upstream of, i.e. in front of, the Sigma-Delta converter. Various kinds of signal strength detectors either in the analog domain prior to the Sigma-Delta converter or in the digital domain after the Sigma-Delta converter can be used to control the variable-gain amplifier.

However, disadvantages of having a signal strength detector in front of the Sigma-Delta converter, i.e. in the analog domain, exist, such as mismatch between detector and Sigma-Delta converter, discrepancy between detected levels and actual limiting levels of the Sigma-Delta converter, limited accuracy and input range of analog signal strength detectors, and additional power consumption and cost of additional circuitry.

Moreover, disadvantages of having a signal strength detector after the Sigma-Delta converter, i.e. in the digital domain, also exist; such as mismatch between digital detector and Sigma-Delta converter, discrepancy between detected levels and actual limiting levels of the Sigma-Delta converter, the detector detecting signal converted by Sigma-Delta converter that may already be deteriorated by the Sigma-Delta converter if the Sigma-Delta converter is overloaded, and additional power consumption and cost of additional circuitry.

Therefore, it is an object of the invention to provide a method of adjusting the input signal level of a Sigma-Delta converter, which provides an accurate and fast automatic gain control function independently of manufacturing spread and drift of various parameters, and which is also less power consuming than the prior art methods.

SUMMARY

According to the invention the object is achieved in that the method comprises the step of generating a control signal as a signal indicating whether said Sigma-Delta converter is operating close to or above an upper limit of a stable operating range. Hereby, a simple and effective way of adjusting the input signal level of a Sigma-Delta converter is achieved, in that the control signal is a signal directly indicative of the condition of the Sigma-Delta converter.

The step of generating a control signal further comprises the step of counting consecutive equal samples in an output signal from said Sigma-Delta converter. Hereby, a signal from the digital domain of the Sigma-Delta converter is used to provide the control signal. This is advantageous in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

According to yet another aspect of the invention, the step of generating a control signal may further comprise the steps of detecting the maximum number of consecutive equal samples in the output signal from said Sigma-Delta converter during a given measurement interval; and providing said detected maximum number of consecutive equal samples as the control signal indicative of the input signal level to said Sigma-Delta converter.

Alternatively, the step of generating a control signal may further comprise the steps of detecting the number of times a specific number of consecutive equal samples in the output signal from said Sigma-Delta converter is counted during a given measurement interval; and providing said detected number of times as the control signal indicative of the input signal level to said Sigma-Delta converter.

According to another aspect of the invention, the step of adjusting the input signal level to said Sigma-Delta converter comprises the steps of comparing said control signal with a reference value; and adjusting a gain of a variable gain amplifier arranged upstream of said Sigma-Delta converter by a predefined change of gain, such that said gain is decreased by said predefined change of gain if said control signal exceeds said reference value and is otherwise increased by said predefined change of gain. This provides a simple method of influencing the gain of the input signal to a Sigma-Delta converter and thus a simple way to ensure that the Sigma-Delta converter operates within its actual operating input level range.

According to yet another aspect of the invention, the step of adjusting the input signal level to said Sigma-Delta converter comprises the steps of calculating from said control signal a corresponding input signal level to said Sigma-Delta converter; calculating a change of gain as a difference between said calculated corresponding input signal level and a predefined reference input signal level; and adjusting a gain of a variable gain amplifier arranged upstream of said Sigma-Delta converter by said calculated change of gain. Hereby, an optimal choice of the influencing of the automatic gain control function can be obtained, so that the Sigma-Delta converter can be controlled to be operating at a predetermined input level.

In one embodiment, the Sigma-Delta converter may be a 1-bit Sigma-Delta converter.

The method according to the invention is thus arranged to employ signals inside the Sigma-Delta converter, i.e. an output from a filter or an output from the Sigma-Delta converter. This renders it possible to provide an accurate AGC function. Moreover, the signals detected render it possible to provide a measure of the operating condition of the Sigma-Delta converter, i.e. whether the Sigma-Delta converter is operating within or beyond its operational input range or close to the limit thereof. The described solution is advantageous because it is independent of manufacturing spread and drift of various parameters in the components of the system.

The method according to the invention is advantageous for, but not limited to signals with a large peak-to-average value, such as OFDM signals used in e.g. Digital Video Broadcasting (DVB), Digital Audio Broadcasting (DAB) and Wireless Local Area Network (WLAN) standards, and multi-carrier type of signals.

It should be noted, that the Sigma-Delta converter can be of any order, e.g. first, second, third, fourth or higher order.

One of the advantages of the Sigma-Delta converter according to the invention is the provision of an accurate signal for adjusting the gain of an input signal to the Sigma-Delta converter. This is useful when the Sigma-Delta converter is the bottleneck in terms of dynamic range, which is often the case. The system according to the invention is advantageous because the true limiting factors for the Sigma-Delta converter are used as measures, despite manufacturing spread and drift of various parameters. As mentioned and in accordance with the invention, monitoring of a number of residual sample values outside a predefined range from a filter of the Sigma-Delta converter, a maximum or a specific number of consecutive equal samples in the output signal from the Sigma-Delta converter, or possibly a combination of these, provides a measure of the "distance" to overload of the Sigma-Delta converter, i.e. a measure of where in the operational input range of the Sigma-Delta converter it is operating.

As mentioned, the invention also relates to an arrangement for performing analog-to-digital conversion, the arrangement comprising a Sigma-Delta converter; means for generating a control signal indicative of an input signal level to said Sigma-Delta converter; and means for adjusting the input signal level to said Sigma-Delta converter in dependence of said control signal. When the arrangement is adapted to generate said control signal as a signal indicating whether said Sigma-Delta converter is operating close to or above an upper limit of a stable operating range, a simple and effective way of adjusting the input signal level of a Sigma-Delta converter is achieved in that the control signal is a signal directly indicative of the condition of the Sigma-Delta converter.

The means for generating a control signal further comprises means for counting consecutive equal samples in an output signal from said Sigma-Delta converter. Hereby, a signal from the digital domain of the Sigma-Delta converter is used to provide the control signal. This is advantageous, in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

In yet another aspect of the invention, the means for generating a control signal further comprises means for detecting the maximum number of consecutive equal samples in the output signal from said Sigma-Delta converter during a given measurement interval and providing said detected maximum number of consecutive equal samples as the control signal indicative of the input signal level to said Sigma-Delta converter.

Alternatively, the means for generating a control signal further comprises means for detecting the number of times a specific number of consecutive equal samples in the output signal from said Sigma-Delta converter is counted during a given measurement interval and providing said detected number of times as the control signal indicative of the input signal level to said Sigma-Delta converter.

According to another aspect of the invention, the means for adjusting the input signal level to said Sigma-Delta converter is arranged to compare said control signal with a reference value; and adjust a gain of a variable gain amplifier arranged upstream of said Sigma-Delta converter by a predefined change of gain, such that said gain is decreased by said predefined change of gain if said control signal exceeds said reference value and is otherwise increased by said predefined change of gain. This provides a simple way of influencing the gain of the input signal to a Sigma-Delta converter and thus a simple way to ensure, that the Sigma-Delta converter operates within its actual operating input level range.

According to yet another aspect of the invention, the means for adjusting the input signal level to said Sigma-Delta converter is arranged to calculate from said control signal a corresponding input signal level to said Sigma-Delta converter; calculate a change of gain as a difference between said calculated corresponding input signal level and a predefined reference input signal level; and adjust a gain of a variable gain amplifier arranged upstream of said Sigma-Delta converter by said calculated change of gain. Hereby, an optimal choice of the influencing of the automatic gain control function can be obtained, so that the Sigma-Delta converter can be controlled to be operating at a predetermined input level.

In one embodiment, the Sigma-Delta converter may be a 1-bit Sigma-Delta converter.

The invention also relates to a wireless communications device comprising the arrangement for performing analog-to-digital conversion described above.

As mentioned, the invention also relates to a device for generating a control signal indicative of an input signal level to a Sigma-Delta converter, wherein the device comprises processing means arranged to generate said control signal; and wherein the device is adapted to provide said control signal to means for adjusting the input signal level to said Sigma-Delta converter. When the device is adapted to receive a signal from said Sigma-Delta converter and to generate said control signal as a signal indicating whether said Sigma-Delta converter is operating close to or above an upper limit of a stable operating range, a simple and effective way of adjusting the input signal level of a Sigma-Delta converter is achieved in that the control signal is a signal directly indicative of the condition of the Sigma-Delta converter.

The device further comprises means for counting consecutive equal samples in an output signal from said Sigma-Delta converter. Hereby, a signal from the digital domain of the Sigma-Delta converter is used to provide the control signal. This is advantageous in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

According to yet another aspect of the invention, the device further comprises means for detecting the maximum number of consecutive equal samples in the output signal from said Sigma-Delta converter during a given measurement interval and providing said detected maximum number of consecutive equal samples as the control signal indicative of the input signal level to said Sigma-Delta converter.

Alternatively, the device further comprises means for detecting the number of times a specific number of consecutive equal samples in the output signal from said Sigma-Delta converter is counted during a given measurement interval and providing said detected number of times as the control signal indicative of the input signal level to said Sigma-Delta converter.

The invention also relates to a computer program and a computer readable medium with program code means for performing the method described above.

BRIEF DESCRIPTION OF THE DRAWINGS

The invention will now be described more fully below with reference to the drawings, in which.

DETAILED DESCRIPTION OF EMBODIMENTS

An example of a low-pass second order Sigma-Delta converter with time-continuous integrators will be described with reference to FIG. 1. It should be noted, that the order of the Sigma-Delta converter indicates the number of integrators in the converter.

Figure 1:
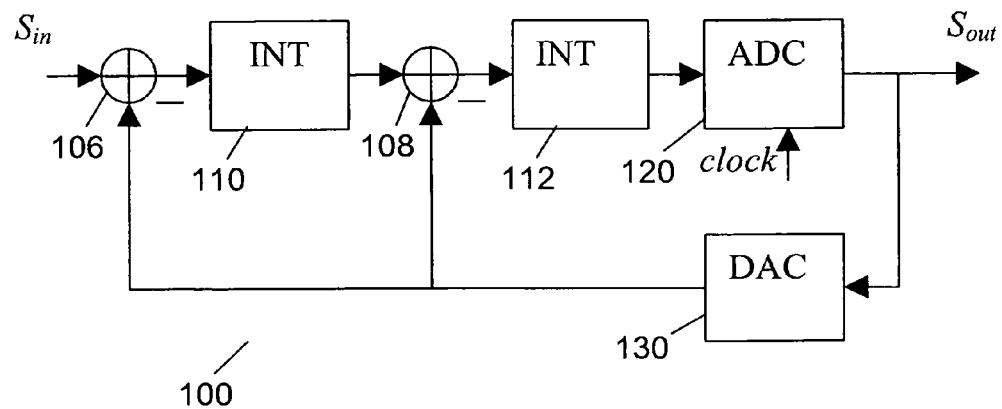
FIG. 1 shows a second-order Sigma-Delta converter.

The converter shown in FIG. 1 is an example of a basic textbook configuration, and it should be noted that the invention is not limited to this specific structure, but can be used in any type of Sigma-Delta converter including both time-continuous and time-discrete with any architecture, order or filter characteristics. The integrators (INTs) in FIG. 1 both have a unity gain at the clock frequency divided by $2\pi$. Furthermore, it is assumed that there is no delay in the AD converter (ADC) and the DA converter (DAC), and that the output of the AD converter is defined by two states $[0, 1]$, while the DA converter maps these states to two output values $[-1, +1]$.

Referring again to FIG. 1, the second-order Sigma-Delta converter (SDC) 100 is shown. The Sigma-Delta converter 100 comprises a filter 112 in the form of an integrator, an analog-to-digital converter (ADC) 120 and a digital-to-analog converter (DAC) 130. The output of the integrator 112 is connected to the input of the analog-to-digital converter 120. The Sigma-Delta converter 100 in FIG. 1 is a second-order Sigma-Delta converter; thus, it comprises another filter 110 in the form of another integrator. Moreover, the Sigma-Delta converter 100 comprises two adders 106, 108, where the input signal $S_{in}$ to the Sigma-Delta converter 100 is input to the adder 106, the output of which is the input to the integrator 110. The other adder 108 is connected between the two integrators 110, 112. The output signal $S_{out}$ from the ADC 120 is output from the Sigma-Delta converter, but also input to the DAC 130 of the Sigma-Delta converter to provide a negative feedback signal within the Sigma-Delta converter, in that the output from the DAC 130 is input to the adders 106 and 108.

To demonstrate the behaviour of the Sigma-Delta converter, MATLAB (a well known mathematical program in the form of a commercial "Matrix Laboratory" package which operates as an interactive programming environment) system-level simulations have been carried out based on an OFDM (orthogonal frequency division multiplex) signal that resembles that of a DVB-T (digital video broadcasting-terrestrial) signal with 8192 carriers of which 6817 carriers are active (non-zero) and modulated using 64QAM (Quadrature Amplitude Modulation). The 8192 carrier positions correspond to a 9.14 MHz bandwidth and the sampling frequency of the Sigma-Delta converter is 64 times this frequency, i.e. approximately 585 MHz.

Figure 2:
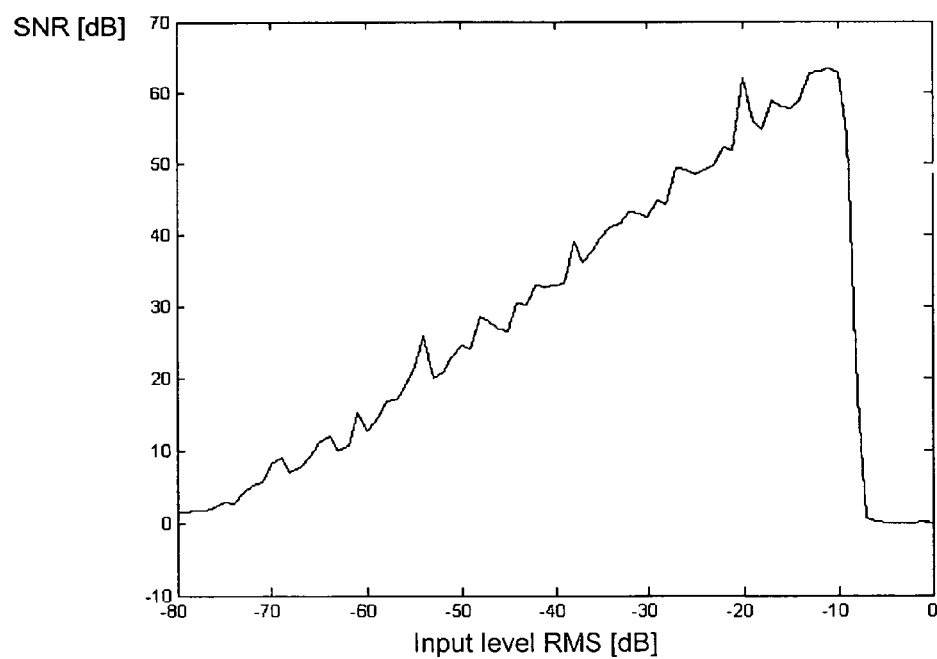
FIG. 2 is a plot of the signal-to-noise ratio (SNR) as a function of OFDM input signal level.

FIG. 2 shows the signal-to-noise ratio (SNR) for the output signal of the Sigma-Delta converter as a function of input RMS (root mean square) level of the total signal given in dB, where 0 dB input corresponds to unity magnitude. The numeric examples given in this specification are all related to the OFDM signal; however, it should be noted that the principles of the invention can be applied to any type of signal.

As mentioned, FIG. 2 is a plot of the signal-to-noise ratio (SNR) as a function of OFDM input signal level for the Sigma-Delta converter shown in FIG. 1. FIG. 2 shows that the SNR increases in a roughly linear fashion up to a certain point where it quickly drops to 0 dB. This is a typical behaviour for Sigma-Delta converters. When the signal reaches levels close to or beyond the DAC output levels, the Sigma-Delta converter cannot track the input signal anymore. This leads to the Sigma-Delta converter becoming overloaded and unstable, and possibly the integrators will saturate as well (assumed to have a maximum allowed signal swing in a real implementation). In short, the Sigma-Delta converter will fail.

The input level, where the failure of the Sigma-Delta converter occurs, depends on the characteristics of the input signal. For example, the Sigma-Delta converter would be able to operate for higher input levels (several dB) if the input signal would be a single sinusoid or a single modulated carrier such as a WCDMA signal as the amplitude distribution for such a signal is rather compact with a small peak-to-average (PAR) value.

Therefore, if the range of input signal levels is larger than the level at which the Sigma-Delta converter is able to operate, under the assumption of a certain minimum SNR requirement, an AGC function with a variable-gain amplifier (VGA) in front of the Sigma-Delta converter will be advantageous for coping with the large dynamic range of signals received, especially in radio receivers in e.g. mobile phone systems, TV broadcast systems, etc.

The invention described here aims to use internal signals of the Sigma-Delta converter as measures to control a VGA to implement an AGC function with high speed and accuracy. In more detail the integrator (or filter in the general case) output signals or the output of the Sigma-Delta converter are monitored to estimate where on the SNR characteristic the Sigma-Delta converter operates. In particular, this scheme is very suitable for OFDM or multi-carrier type of signals with large PAR.

An important aspect of Sigma-Delta converter behaviour is found by considering the amplitude distribution (or probability density function) of the integrator output signals, in particular the integrator that drives the quantizer in the Sigma-Delta converter. If the 1-bit Sigma-Delta converter configuration is considered again with a DVB-T signal it is found that the amplitude distribution of the integrator outputs is very much the same for the whole useful input level range of the Sigma-Delta converter. However, as we pass the peak SNR level the distribution rapidly changes.

Figure 3:
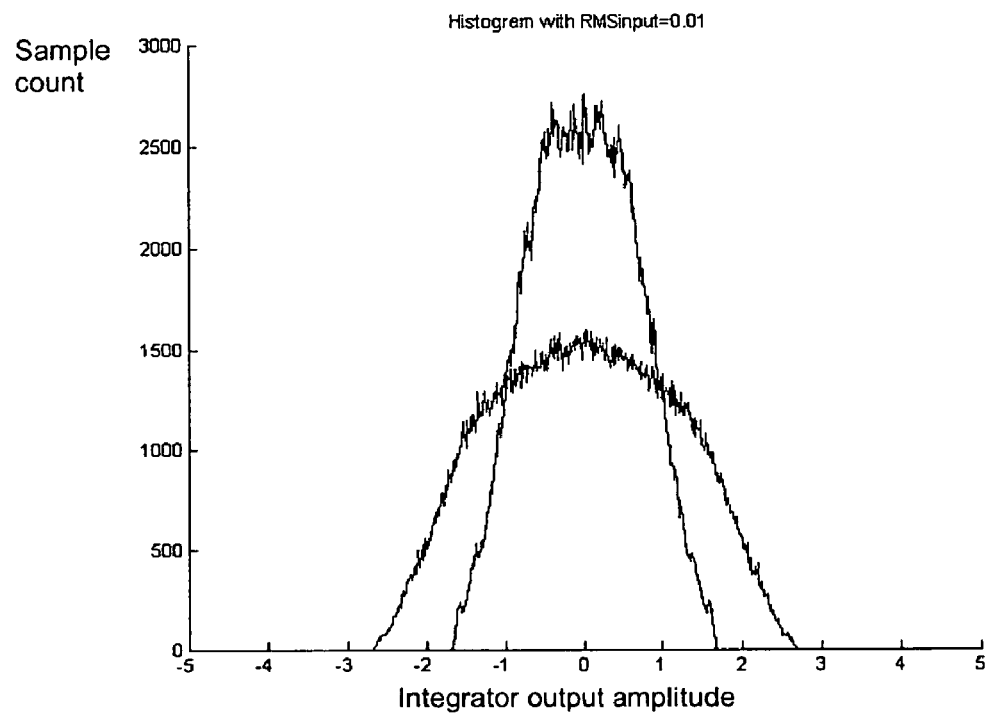
FIGS. 3 to 5 are histograms of first and second integrator output signals at input levels of −40 dB, −20 dB and −10 dB, respectively.
Figure 4:
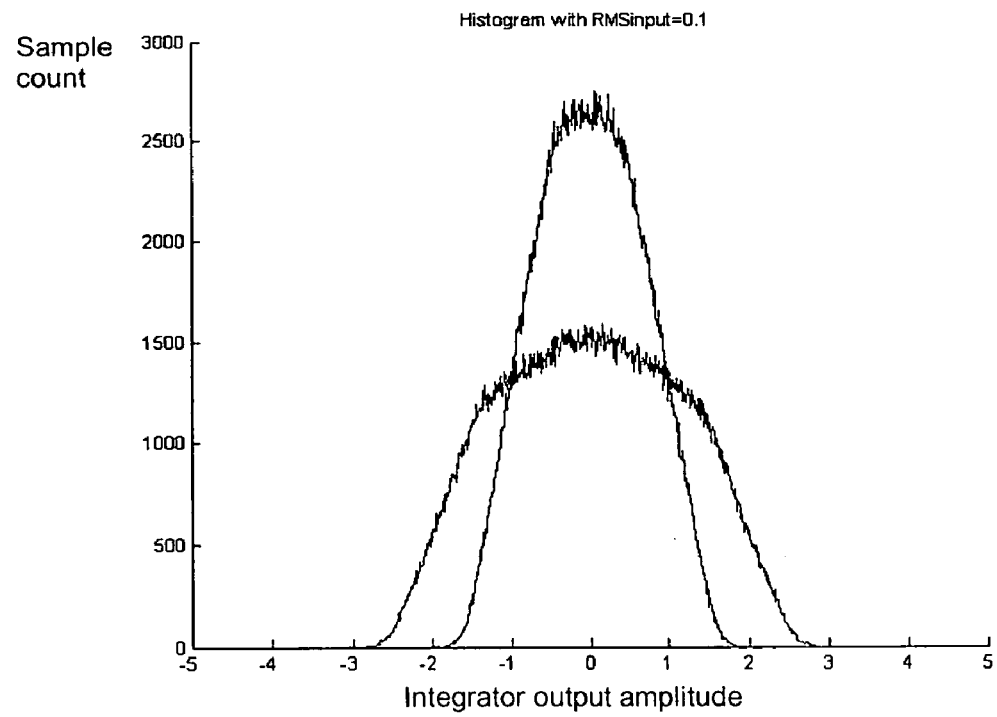
Figure 5:
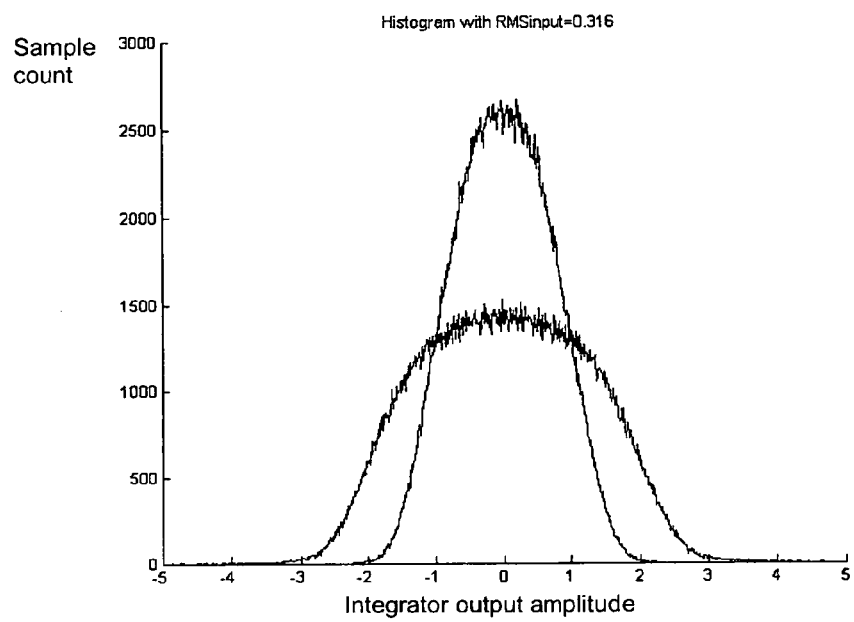

FIGS. 3 to 5 are histograms of output signals from the two integrators 110 and 112 (see FIG. 1) at input signal levels of −40 dB, −20 dB and −10 dB, respectively, using an OFDM signal. In all three figures, the narrow histogram corresponds to the output signals from the upstream integrator 110, whilst the broader histogram corresponds to output signals from the downstream integrator 112. These histograms, which thus are estimates of amplitude distribution, have been obtained by calculating histograms from integrator output samples recorded from simulations. At −40 dB and −20 dB the output of the upstream integrator 110 (the narrow histogram) is well contained within the range from −2 to 2, whereas the output of the downstream integrator 112 is well contained within the range from −3 to 3. At −10 dB (see FIG. 5), there is a noticeable residue outside these ranges; at the same time the Sigma-Delta converter is functioning close to the maximum possible SNR (see FIG. 2).

Figure 6:
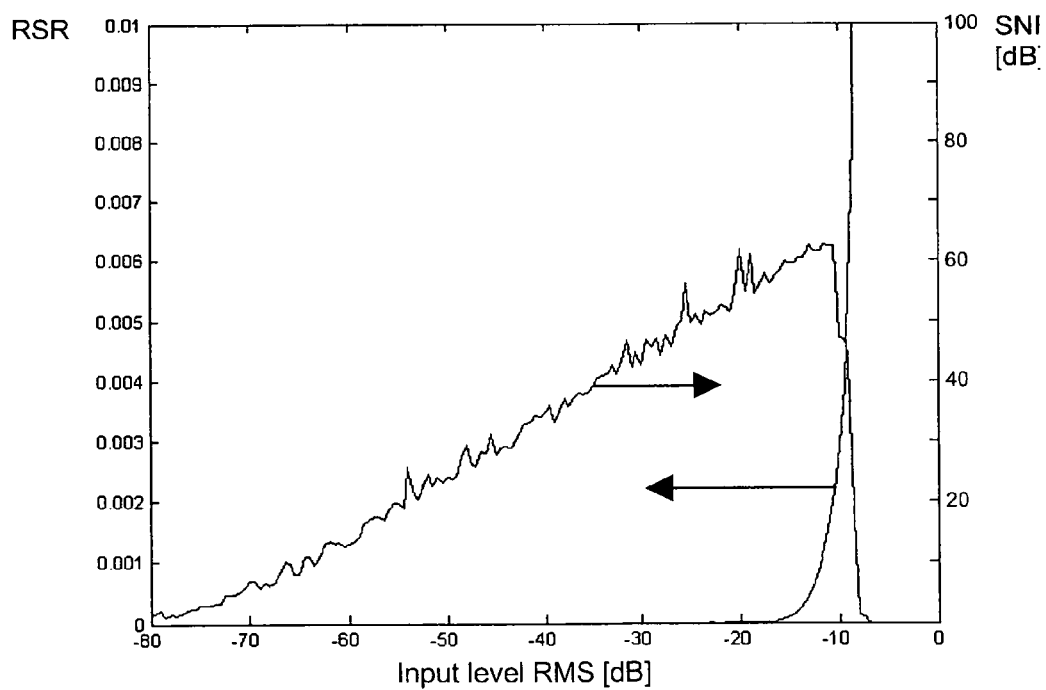
FIG. 6 is a plot of the SNR of a Sigma-Delta converter and of the signal RSR as a function of OFDM input signal level.

At input levels beyond −10 dB, the number of samples outside the [−2, 2] and [−3, 3] ranges increases dramatically. These samples are referred to as residual samples. This is illustrated in FIG. 6, which shows the ratio of the number of residual samples from the downstream integrator 112 to the total number of samples as a function of OFDM input signal level; this ratio is denoted Residual Sample Ratio (RSR). The corresponding signal-to-noise ratio (SNR) curve from FIG. 2 is also shown. It is clear that the RSR increases substantially at input levels approaching the maximal input level. In general, it can be seen from FIG. 6 that RSR is one suitable measure that can be detected easily to provide information relating to approximately where on the SNR characteristics the Sigma-Delta converter is currently operating. It should be noted that the horizontal arrows in FIG. 6 indicate the appropriate numeric scales in the figure, which should be used for reading the numeric values of the curves.

Figure 7:
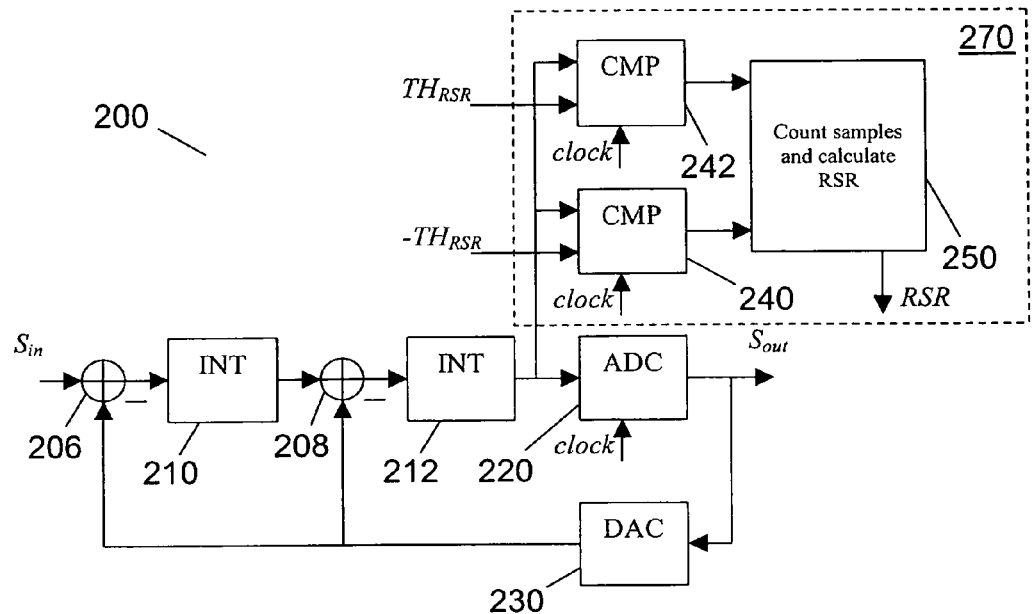
FIG. 7 shows a second order Sigma-Delta converter comprising means for creating a first control signal, said means being connected between the filter and the AD converter of the Sigma-Delta converter.

FIG. 7 shows a circuit 200 comprising a Sigma-Delta converter (SDC) and means 270 for creating a control signal RSR. Again, the Sigma-Delta converter 200 is a second order Sigma-Delta converter comprising a filter 212 in the form of an integrator, an analog-to-digital converter (ADC) 220 and a digital-to-analog converter (DAC) 230. The output of the integrator 212 is connected to the input of the ADC 220. Again, the Sigma-Delta converter 200 in FIG. 7 is a second-order Sigma-Delta converter; thus, it comprises another filter 210 in the form of another integrator. Moreover, the Sigma-Delta converter 200 comprises two adders 206, 208, where the input signal $S_{in}$ to the Sigma-Delta converter 200 is input to the adder 206, the output of which is the input to the upstream integrator 210. The other adder 208 is connected between the two integrators 210, 212. The output signal $S_{out}$ from the ADC 220 is output from the Sigma-Delta converter, but also input to the DAC 230 of the Sigma-Delta converter 200 to provide a negative feedback signal to the Sigma-Delta converter, in that the output from the DAC 230 is input to the adders 206 and 208.

According to one embodiment of the invention, the RSR may be obtained by adding two comparators (CMPs) 240, 242 to the Sigma-Delta converter 200. The comparators 240, 242 are connected to the output of the downstream integrator 212, e.g. the integrator that drives the quantizer of the ADC 220. The comparators 240, 242 are configured to detect when the integrator output signal exceeds certain threshold levels $TH_{RSR}$ and $-TH_{RSR}$, being input to the comparators 242 and 240, respectively. For example the threshold levels could equal −3 and +3 as in the example discussed above. Subsequently, the RSR can be calculated from the sampled comparator outputs, e.g. in a processor block 250 arranged to count samples and calculate RSR. The output signal from the processor block 250 could thus be the RSR. This RSR could be input to a gain control component upstream of the Sigma-Delta converter 200, which gain control component is arranged to control the gain of the input signal to the Sigma-Delta converter, e.g. to ensure that the Sigma-Delta converter 200 operates well within its operation range. In the example shown in FIG. 6, this corresponds to input levels well below −10 dB.

Figure 8:
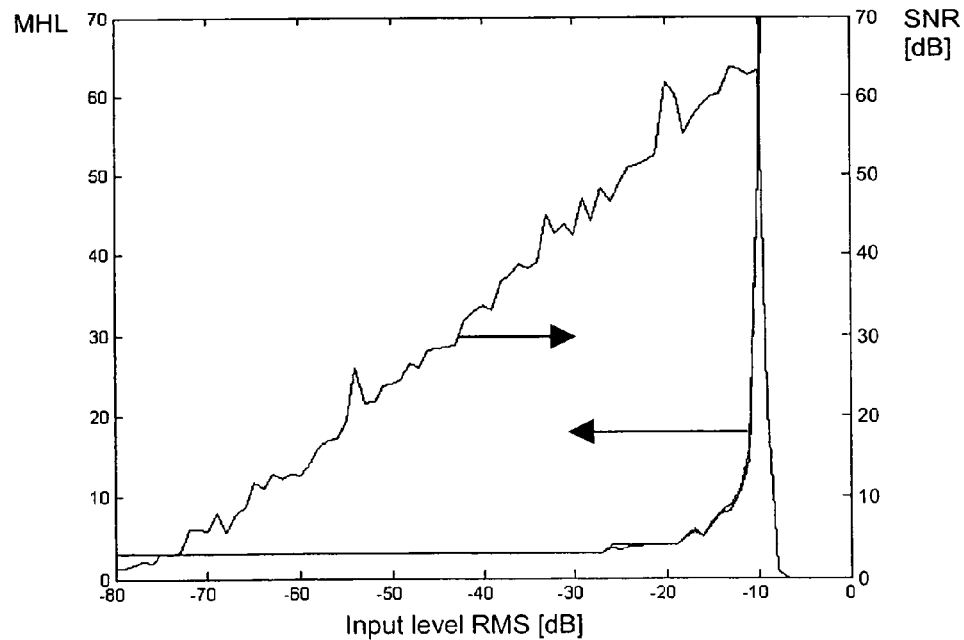
FIG. 8 is a plot of the SNR of a Sigma-Delta converter and of the signal MHL as a function of OFDM input signal level.

Another approach of detecting approximately where on the SNR characteristics the Sigma-Delta converter operates is to consider the maximum number of consecutive equal samples from the Sigma-Delta converter output during a given measurement interval; this measure is denoted the maximum hold length (MHL). This is shown in FIG. 8, which shows a plot of the SNR of a Sigma-Delta converter and of the MHL as a function of OFDM input signal level. In FIG. 8 both maximum MHL (maximum over 10 simulated OFDM symbols) and averaged maximum MHL (maximum per OFDM symbol, averaged over 10 OFDM symbols) are shown; these two curves are substantially overlapping and as it is shown, they are almost constant up to an input level of approximately −27 dB, rising steadily at input levels between approximately −27 dB and approximately −12 dB and thereafter rising drastically beyond −12 dB. In FIG. 8 the corresponding SNR result is also shown (corresponding to the plot in FIG. 2). It is noted that the two MHL measures differ only slightly, i.e. the spread of this measure from one symbol to another is rather limited and thus a single symbol measurement or even a shorter measurement interval can be sufficient to provide a control signal to influence an AGC upstream of the Sigma-Delta converter 200. The horizontal arrows in FIG. 8 indicate the appropriate numeric scales in the figure which should be used for reading the numeric values of the curves.

The shape of the MHL curve in FIG. 8 qualitatively resembles the curve of the RSR shown in FIG. 6. However, in contrast to the RSR in FIG. 6, the MHL in FIG. 8 can easily be detected in the digital domain without additional analog building blocks like comparators. One method of determining MHL is illustrated in FIG. 9.

Figure 9:
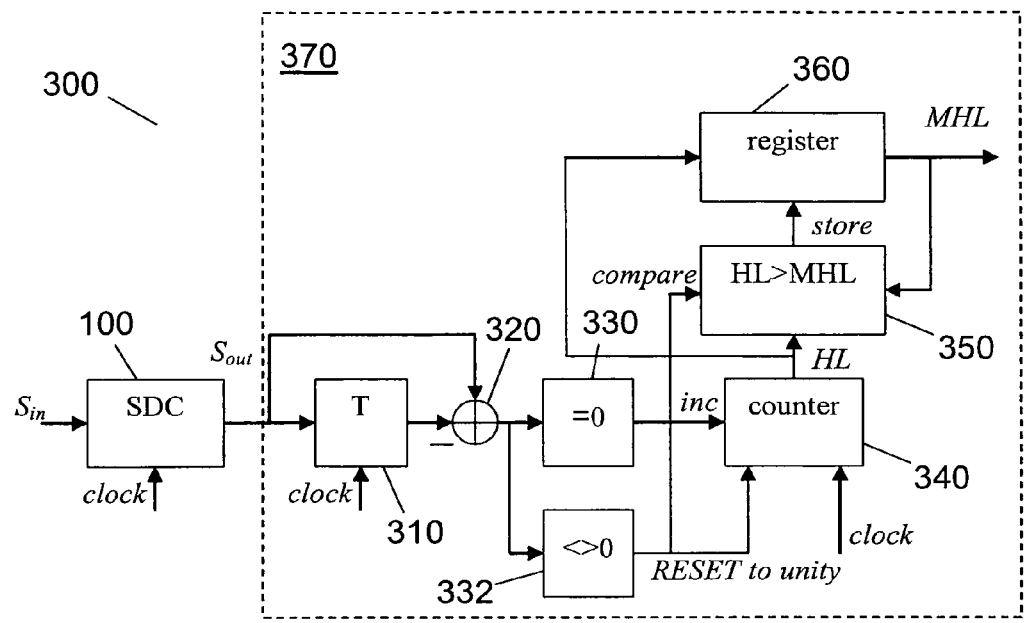
FIG. 9 shows a converter comprising a Sigma-Delta converter and means for creating a first control signal, said means being connected downstream of the Sigma-Delta converter.

FIG. 9 shows a circuit 300 comprising a Sigma-Delta converter (SDC) 100 and means 370 for creating a control signal MHL. It should be noted that said means 370 is connected downstream of the Sigma-Delta converter 100. The Sigma-Delta converter 100 could e.g. be a Sigma-Delta converter 100 as shown in FIG. 1 or a Sigma-Delta converter of another order.

An output sample from the Sigma-Delta converter 100 (in FIG. 9) at one time instance is compared, by subtraction in an adder 320, with the previous sample, which has been delayed one clock period by use of a one-clock-period delay element (T) 310. Hereby, a change in the Sigma-Delta converter output, $S_{out}$, can be detected.

A register 360 is used to hold the current MHL value. When a change of output from the Sigma-Delta converter is detected, the content of the register is compared with the most recently measured hold length HL. If the HL is larger than the content of the register 360, the HL should be stored in the register 360 as the new and higher MHL.

A counter 340 is used to measure the hold length, HL. Thus, this counter should start counting from 1 (one) and be incremented by 1 for every sample that is the same as its previous sample. When a change of Sigma-Delta converter output is detected the counter 340 contains the most recent hold length.

Block 330 generates an active signal whenever the current sample and its previous sample are identical. This signal is used to increment the counter 340 by 1.

Block 332 generates an active signal whenever the current sample and its previous sample are different. This signal is used to trigger a comparison in block 350 of the output of the counter 340, the most recent HL, and the current MHL stored in register 360. If the output of the counter 340 is larger than the current MHL stored in register 360 the block 350 generates an active signal that is used to store the output of the counter 340 into the register 360. The signal from 332 is also used to reset the counter 340 to 1 (one) as a change of the output from the Sigma-Delta converter means that a new HL should be measured.

It should be understood that the counter 340 should always be reset to 1 and that the value in the register 360 should always be reset to zero prior to the start of the measurement interval. The control signal MHL can be used to control a variable gain amplifier (VGA) upstream of the Sigma-Delta converter 300 to influence its gain function, typically via an AGC block as described below and shown in FIG. 14.

Figure 10:
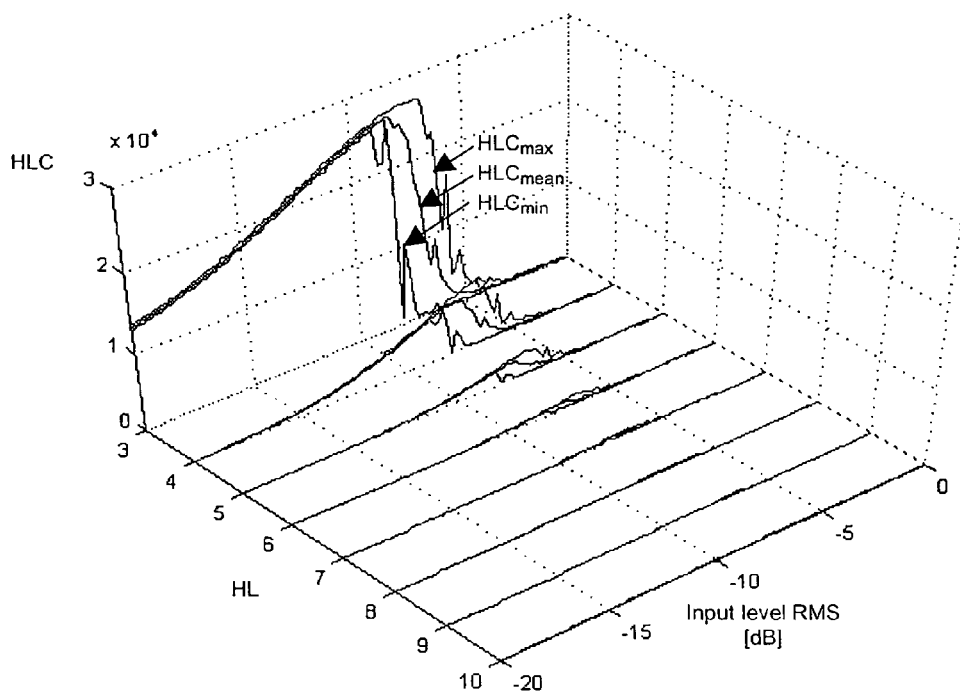
FIGS. 10 and 11 are plots of the signal HLC as a function of OFDM input signal level.

A third approach to provide a control signal indicative of the SNR performance of a Sigma-Delta converter is related to the MHL measure. However, instead of detecting the MHL, i.e. the maximum number of consecutive equal samples recorded during a given measurement interval, the number of hold lengths having a specific length can be detected. This measure will be referred to as hold length count, HLC. In FIG. 10, the HLC is shown as a function of input power for various hold lengths (HLs) with a measurement interval corresponding to one OFDM symbol. For each HL there are actually three curves for the minimum, maximum and average HLC, respectively, detected over 30 random OFDM symbols (in FIG. 10, these curves are denoted $HLC_{min}$, $HLC_{max}$, $HLC_{mean}$). It is readily seen that the difference between the maximum and minimum HLC is very small for the input signal range where the Sigma-Delta converter is not overloaded, i.e. below −10 dB. Thus HLC is a very accurate measure for the operation condition of the Sigma-Delta converter with respect to SNR in the above range.

Figure 11:
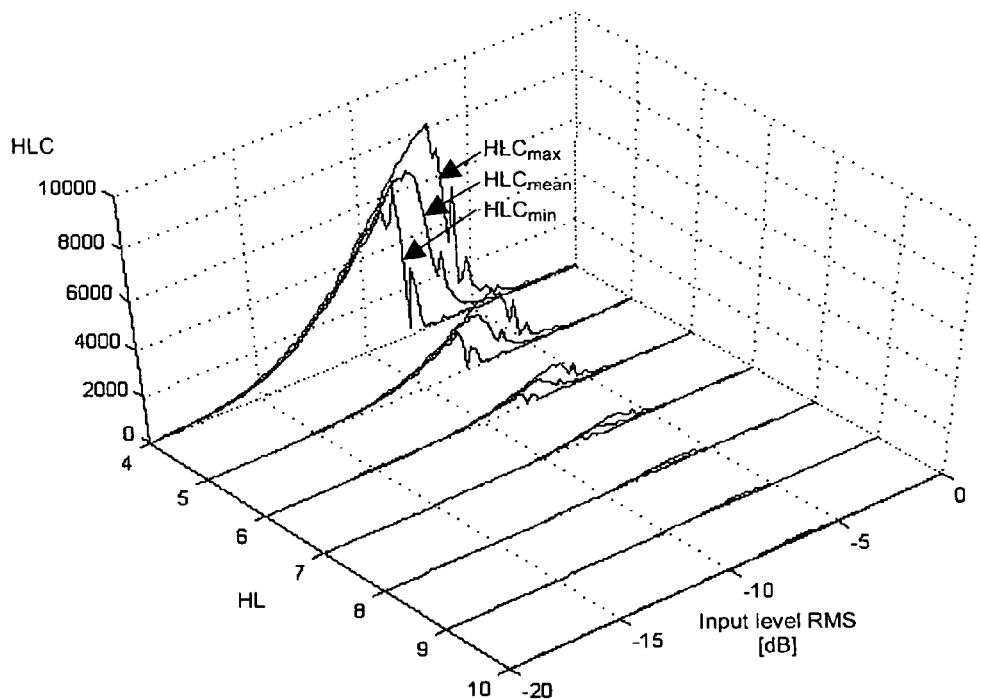

FIG. 11 is another plot of the control signal HLC as a function of OFDM input signal level; however in FIG. 11 the curve corresponding to HL=3 has been excluded to demonstrate that HL values larger than 3 can also be used for HLC detection with a high degree of accuracy. Again, for each HL there are actually three curves for the minimum, maximum and average HLC, respectively, detected over 30 random OFDM symbols, denoted $HLC_{min}$, $HLC_{max}$, $HLC_{mean}$.

Figure 12:
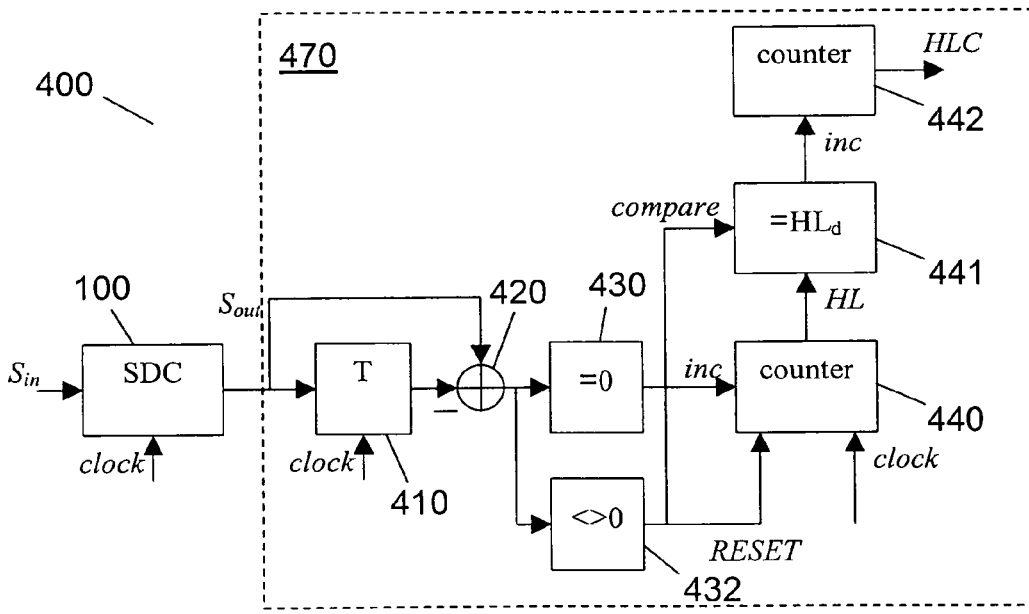
FIG. 12 shows an alternative converter comprising a Sigma-Delta converter and means for creating a first control signal, said means being connected downstream of the Sigma-Delta converter.

FIG. 12 shows a circuit 400 comprising a Sigma-Delta converter 100 and means 470 for creating a control signal HLC. As in FIG. 9, said means 470 is connected downstream of the Sigma-Delta converter 100. The Sigma-Delta converter 100 could e.g. be a Sigma-Delta converter 100 as shown in FIG. 1 or a Sigma-Delta converter of another order.

The output sample from the Sigma-Delta converter 100 (in FIG. 12) at one time instance is compared, by subtraction in an adder 420, with the previous sample, which has been delayed one clock period by use of a one-clock-period delay element (T) 410. Hereby, a change in the Sigma-Delta converter output, $S_{out}$, can be detected.

A counter 442 is used to measure the HLC of a selected or desired $HL_d$. When a change of output from the Sigma-Delta converter is detected this counter should be incremented by 1 if the most recent HL is equal to the desired hold length, $HL_d$.

A counter 440 is used to measure the hold length, HL. Thus, this counter should start counting from 1 (one) and be incremented by 1 for every sample that is the same as its previous sample. When a change of Sigma-Delta converter output is detected the counter 440 contains the most recent hold length.

Block 430 generates an active signal whenever the current sample and its previous sample are identical. This signal is used to increment the counter 440 by 1.

Block 432 generates an active signal whenever the current sample and its previous sample are different. This signal is used to trigger a comparison in block 441 of the output of the counter 440 and the desired hold length, $HL_d$. If they are the same block 441 generates an active signal that is used to increment the counter 442 by 1. The signal from 432 is also used to reset the counter 440 to 1 (one) as a change of the output from the Sigma-Delta converter means that a new HL should be measured.

The output from the counter 442 is the measured hold length count $HLC_m$ (measured over a predetermined number of clock periods), which also forms a control signal that can be used to control a variable gain amplifier (VGA) upstream of the Sigma-Delta converter 400 to influence its gain function, typically via an AGC block as described below and shown in FIG. 14.

Figure 13:
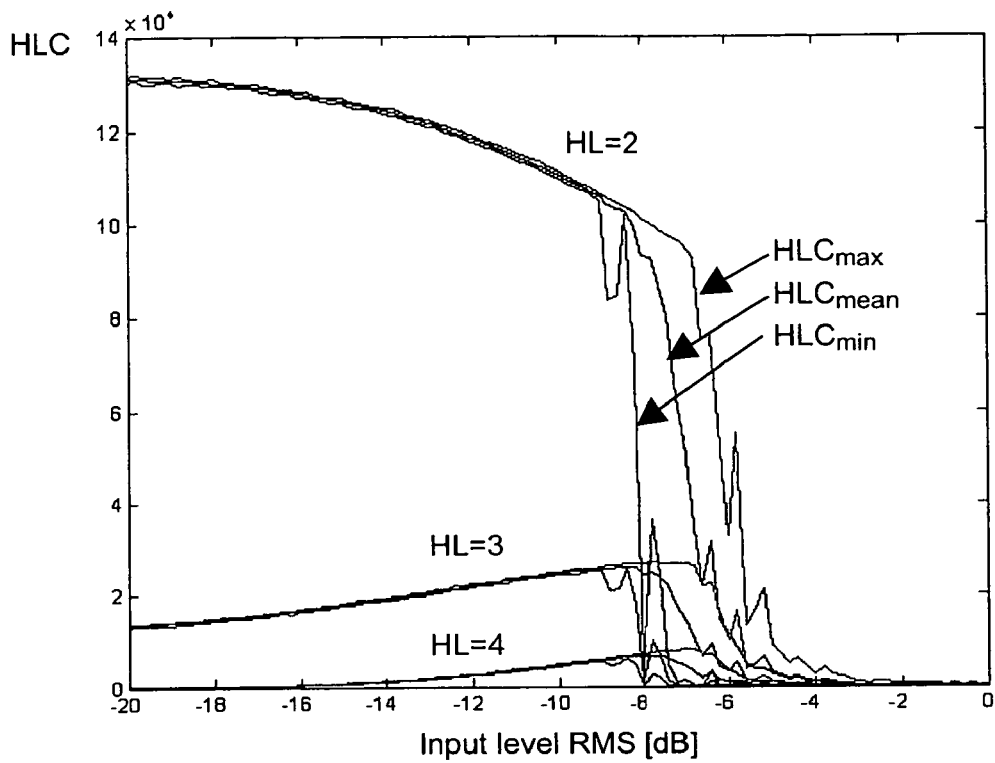
FIG. 13 is a plot of the signal HLC as a function of OFDM signal input level.

It should be noted, that the use of the HLC as the control signal will not provide information on whether the Sigma-Delta converter is overloaded or not, in that a small HLC can be detected both for low input signals and for large input signals for hold length HL≧3. For this reason, the MHL or RSR measurement techniques can be used for the sole purpose of detecting overload. However, instead of measuring HLC for HL=3 or higher, a value of HL=2 can be used for detecting overload. In FIG. 13, which is a plot of the control signal HLC as a function of OFDM signal input level, the HLC is shown as a function of input power. From FIG. 13 it can be seen that for HL=2, the HLC decreases continually with increasing input power well beyond the −10 dB input signal level where overload start to manifest itself. Therefore the HLC for HL=2 can be used to detect overload and indicate good Sigma-Delta converter performance. Again, for each HL there are actually three curves for the minimum, maximum and average HLC, respectively, detected over 30 random OFDM symbols, denoted $HLC_{min}$, $HLC_{max}$, $HLC_{mean}$.

Moreover, it should be noted that although FIGS. 9 and 12 and the description thereof indicate the use of adders with one of the inputs being subtracted, other means for comparing two single bits for equality exist. One example could be to use an XOR gate that would result in an output of "1" only when the two inputs are different, i.e. when the Sigma-Delta converter changes its output states. Other alternatives are conceivable, too.

Figure 14:
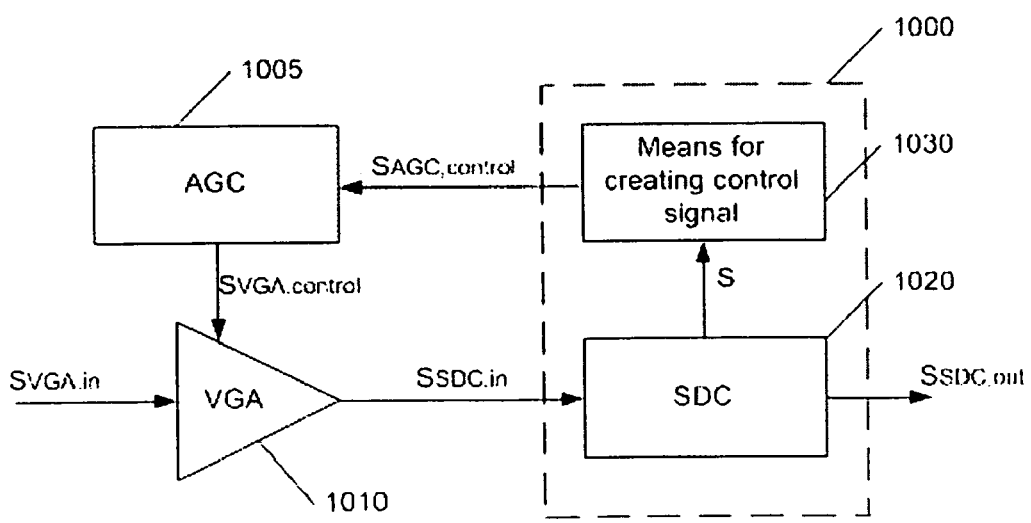
FIG. 14 is a schematic drawing of a variable gain amplifier connected to a Sigma-Delta converter, which is connected to means for creating a first control signal.

FIG. 14 is a schematic drawing indicating how the input signal level can be adjusted by use of one of the control signals described above. A variable gain amplifier (VGA) 1010 is connected to a converter 1000 comprising a Sigma-Delta converter 1020 connected to or comprising means 1030 for creating a first control signal, $S_{AGC,control}$. An AGC block 1005 receives the first control signal, $S_{AGC,control}$, and generates and outputs a second control signal, $S_{VGA,control}$, to the VGA 1010. The second control signal, $S_{VGA,control}$, is arranged to change/modify the gain of the VGA as required by the AGC block.

FIG. 14 moreover shows that a signal, $S_{VGA,in}$, is input to the VGA 1010. This signal, $S_{VGA,in}$, is the signal to be analog-to-digital converted in an AD converter implemented as a Sigma-Delta converter. However, first an appropriate change of magnitude of the input signal, $S_{VGA,in}$, might be applied by use of the VGA 1010. Subsequent to the possible change of magnitude of the input signal, $S_{VGA,in}$, the VGA 1010 outputs the signal $S_{SDC,in}$ to the Sigma-Delta converter 1020. The Sigma-Delta converter 1020 processes the input signal, $S_{SDC,in}$, and outputs the converted, digital signal $S_{SDC,out}$ for further digital processing. The Sigma-Delta converter 1020 moreover outputs a signal S to the means 1030 for creating a first control signal. As described above, the signal S could be the converted digital signal, $S_{SDC,out}$, or the signal S could be an output signal from the filter of the Sigma-Delta converter 1020. Subsequently, the means 1030 creates the first control signal $S_{AGC,control}$ as explained above. This first control signal $S_{AGC,control}$ could comprise RSR, MHL, HLC or a combination of those. The first control signal $S_{AGC,control}$ is input to the AGC block 1005 that comprises an algorithm which may typically be implemented either in the digital or analog domain or in both. The AGC block 1005 processes the first control signal $S_{AGC,control}$ to find a suitable change of gain of the VGA and generates and outputs the required signal, $S_{VGA,control}$ to the VGA 1010 to achieve the required change of gain (if any) in the VGA 1010.

The configuration shown in FIG. 14 is described above in connection with the use of the first control signal from the means for creating the first control signal to influence a VGA upstream of the Sigma-Delta converter. It is understood, that the Sigma-Delta converter 1020 and the means 1030 together form an Sigma-Delta converter 1000 according to an embodiment of the invention (such as the Sigma-Delta converters shown in FIG. 7, FIG. 9 or FIG. 12). The means 1030 outputs a first control signal $S_{AGC,control}$, which is fed to the AGC 1005 which in turn generates and outputs a second control signal, $S_{VGA,control}$, to the VGA 1010 upstream of the Sigma-Delta converter 1000. Hereby, the VGA 1010 can be influenced and/or guided so as to ensure that the Sigma-Delta converter 1000 operates well within its limits. It should be noted that the configuration shown in FIG. 14 is an example only. Additional components could be present, so that the output from the VGA 1010 might not be input directly to the Sigma-Delta converter, but could be arranged to control the Sigma-Delta converter 1000 and be input to the Sigma-Delta converter 1000 via additional components. Moreover, it is also conceivable that additional components are present between the output from the Sigma-Delta converter 1000 and the AGC 1005 and/or between the AGC 1005 and the VGA 1010.

As mentioned, the control signal $S_{AGC,control}$ can be one of the measures RSR, MHL and HLC, and the algorithm of the AGC block 1005 then decides how the gain of the VGA 1010 is controlled from this signal. In the following two examples of such an algorithm is described in further detail.

In the first example the AGC strives towards a nominal input e.g. with respect to a desired SNR by very simple means. The nominal SNR is referred to as $SNR_0$, and the corresponding RSR, MHL, and HLC are defined by $RSR_0$, $MHL_0$, and $HLC_0$ respectively. $RSR_m$, $MHL_m$, $HLC_m$ denote the measured RSR, MHL, and HLC values, respectively. Based on these quantities one possible flow chart of an AGC function is outlined in FIG. 15, FIG. 16, and FIG. 17 based on the RSR, MHL, and the HLC quantity, respectively. In these flow charts ΔG refers to a change of gain e.g. in a VGA prior to the Sigma-Delta converter and this term could be defined in e.g. linear magnitude, linear power or dB.

Figure 15:
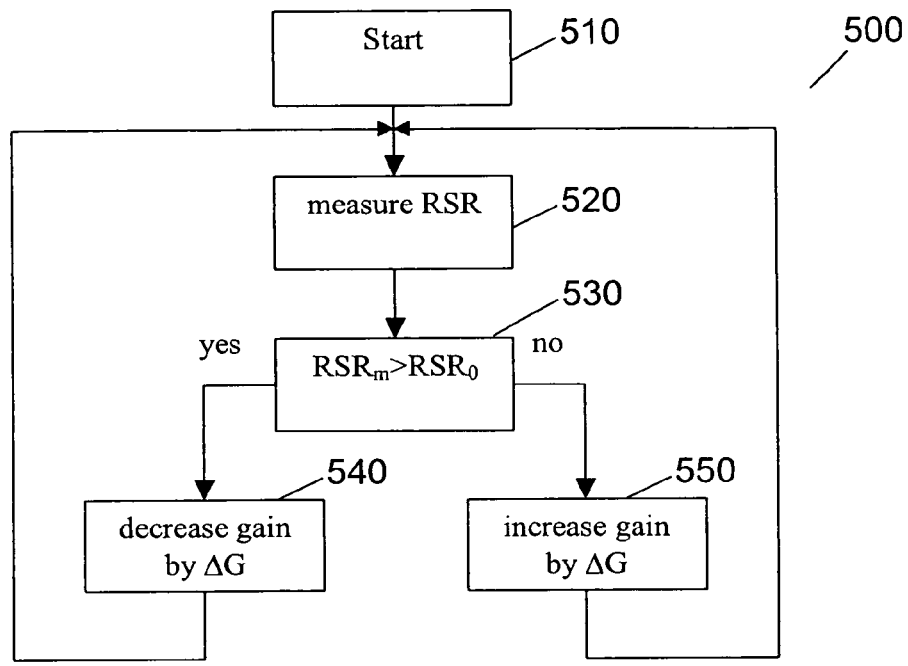
FIGS. 15 to 17 show flow charts of a first example of an algorithm for controlling the gain of a variable gain amplifier, based on measured RSR, MHL and HLC values, respectively.

In the method 500 shown in FIG. 15, in which the Residual Sample Ratio is used as the control signal $S_{VGA,control}$, the flow is started in step 510 and continues to step 520, wherein the RSR is measured, thus providing the first control signal $RSR_m$. This step takes place in the means 1030 in FIG. 14. In the subsequent step 530 the $RSR_m$ from the means 1030 is compared with the nominal RSR value $RSR_0$ relating to a nominal input level that corresponds to a desired SNR. If it is determined in step 530 that the measured RSR, i.e. $RSR_m$, is greater than the nominal RSR, i.e. $RSR_0$, the flow continues to step 540, wherein the AGC block 1005 (see FIG. 14) influences the gain of the VGA 1010 (FIG. 14) to be decreased by ΔG. Alternatively, if it is determined in step 530 that $RSR_m$ is smaller than the nominal value $RSR_0$, the flow continues to step 550, wherein the AGC block 1005 (FIG. 14) influences the gain of the VGA 1010 (FIG. 14) to be increased by ΔG. From step 540 and from step 550 the flow returns to step 520.

Figure 16:
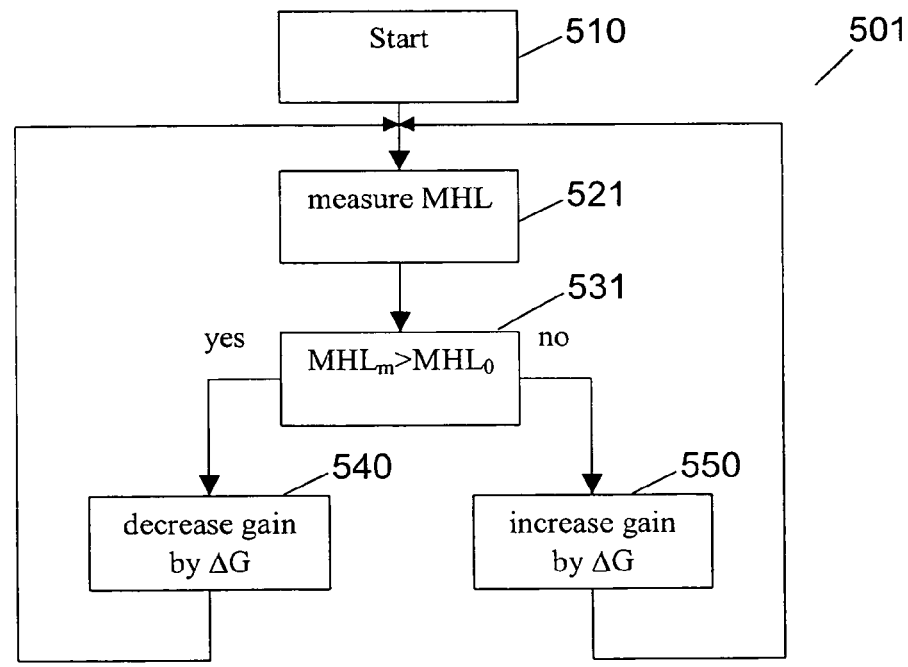
Figure 17:
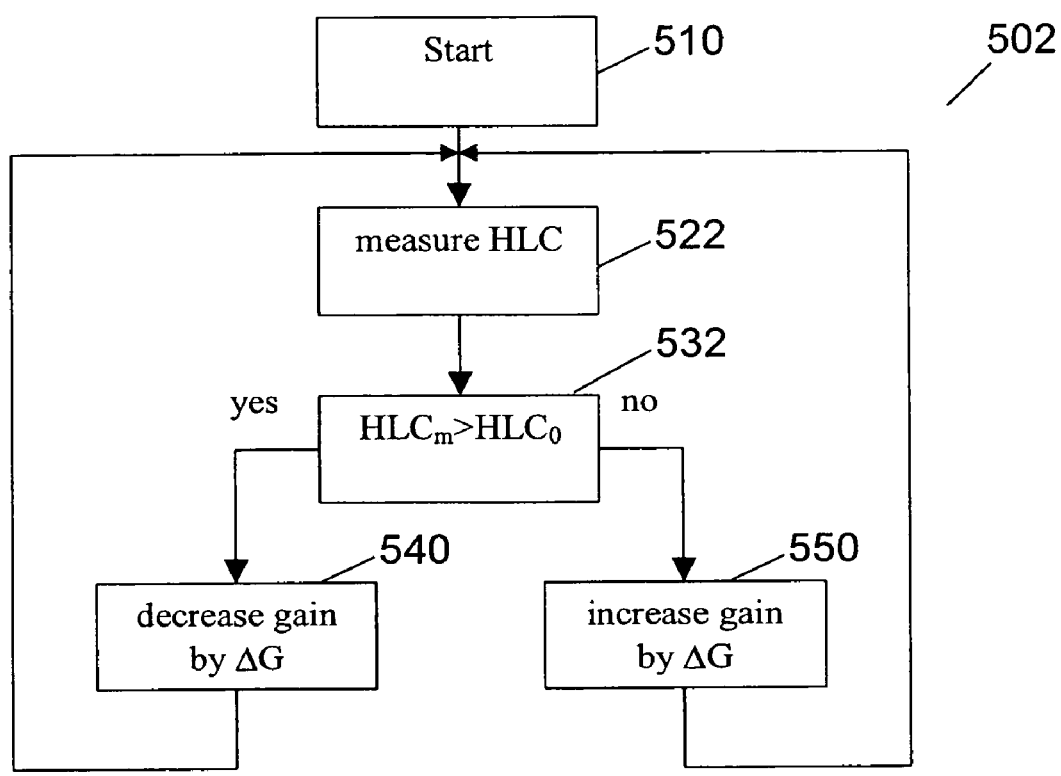

In FIG. 15 the RSR was used as the control signal $S_{AGC,control}$. Corresponding flow charts in which the measures MHL and HLC, respectively, are used as the control signal $S_{AGC,control}$ are shown in FIGS. 16 and 17. In the flow chart 501 of FIG. 16 the steps 521 and 531, in which the MHL is used, correspond to steps 520 and 530 of FIG. 15, while the remaining steps are unchanged. Similarly, in the flow chart 502 of FIG. 17 the steps 522 and 532, in which the HLC is used, correspond to steps 520 and 530 of FIG. 15, while the remaining steps are unchanged.

The method 500, 501, 502 provides a very simple influence of the AGC function, as it only relies on the sign of the discrepancy between optimal and measured RSR, MHL, and HLC, respectively, and based on this the gain will be changed by a fixed step.

The magnitude of ΔG should be sufficiently large to track the variations of the RMS value of the input signal such that a certain minimum SNR can be guaranteed. Thus minimum ΔG can be found if the maximum variation of signal strength during a measurement/gain-change interval is known. There is also an upper limitation of ΔG as the measurement/estimation of RSR, MHL, or HLC will be more or less noisy depending on e.g. measurement time. It may then be justified to choose as small a ΔG as possible while still complying with the first (minimum magnitude) requirement on ΔG to obtain a more robust tracking of the signal strength. Also, another reason to have a small ΔG is to avoid erroneous corrections of VGA gain due to noise in the measurement of RSR, MHL, or HLC that could cause an overloaded Sigma-Delta converter if the signal strength into the Sigma-Delta converter becomes too large.

A more elaborate and faster solution could exploit the non-linear relationship between RSR, MHL, or HLC and the input power and then determine the optimal choice of ΔG, which again refers to a change of gain e.g. in a variable gain amplifier prior to the Sigma-Delta converter and this term could be defined in e.g. linear magnitude, linear power or dB. For example, if the relation between the RSR, MHL, or HLC values and the input signal level in dB is defined by a function $RSR=f(P_{in})$, $MHL=f(P_{in})$, or $HLC=f(P_{in})$, the inverse function $P_{in}=f^{-1}(RSR)$, $P_{in}=f^{-1}(MHL)$, $P_{in}=f^{-1}(HLC)$ can be used to find the estimated input power for a given RSR, MHL, and HLC, respectively. An AGC flow chart based on this function is given in FIG. 18, FIG. 19, and FIG. 20 for the RSR, MHL, and HLC quantities, respectively.

Figure 18:
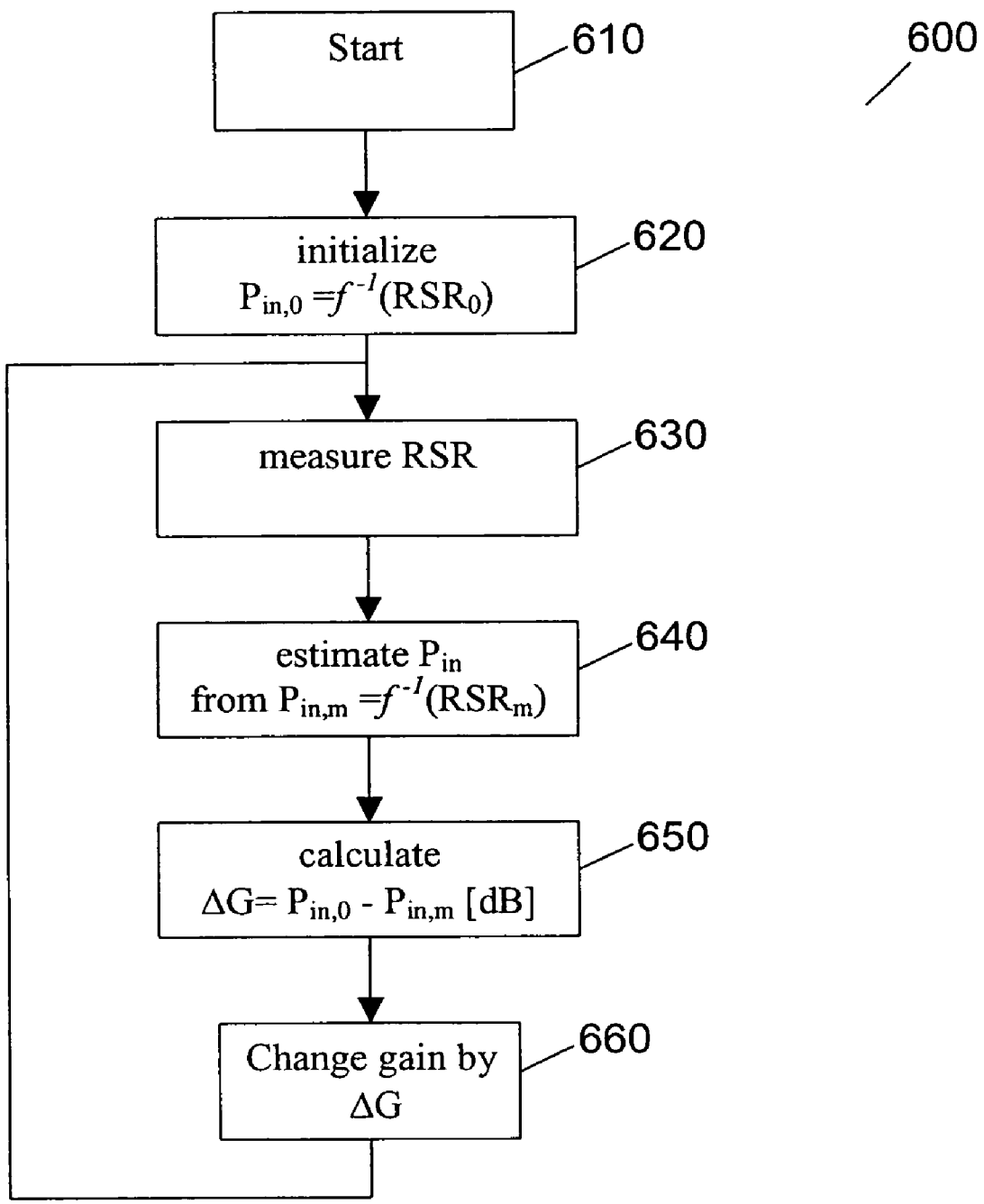
FIGS. 18 to 20 show flow charts of a second example of an algorithm for controlling the gain of a variable gain amplifier, based on measured RSR, MHL and HLC values, respectively.

The method 600, which is shown in FIG. 18 and based on the use of RSR as the control signal, starts in step 610 and continues to step 620, wherein a nominal inverse function value $P_{in,0}$ is calculated as the above mentioned inverse function of the nominal Residual Sample Ratio $RSR_0$. In step 630, the actual Residual Sample Ratio $RSR_m$ is measured. This step takes place in the means 1030 in FIG. 14. Thereafter, in step 640, an estimated input power $P_{in,m}$ is calculated/estimated by calculating the inverse function of the $RSR_m$. Subsequently, in step 650, the ΔG is calculated in the AGC block 1005 (See FIG. 14) as the difference between $P_{in,0}$ and $P_{in,m}$, and in step 660 the gain of the VGA 1010 is influenced to be changed by the amount ΔG.

Thus, the method 600 provides the optimal choice of ΔG. It should be noted that the power levels $P_{in,0}$ and $P_{in,m}$ in the example above are in dB scale.

Figure 19:
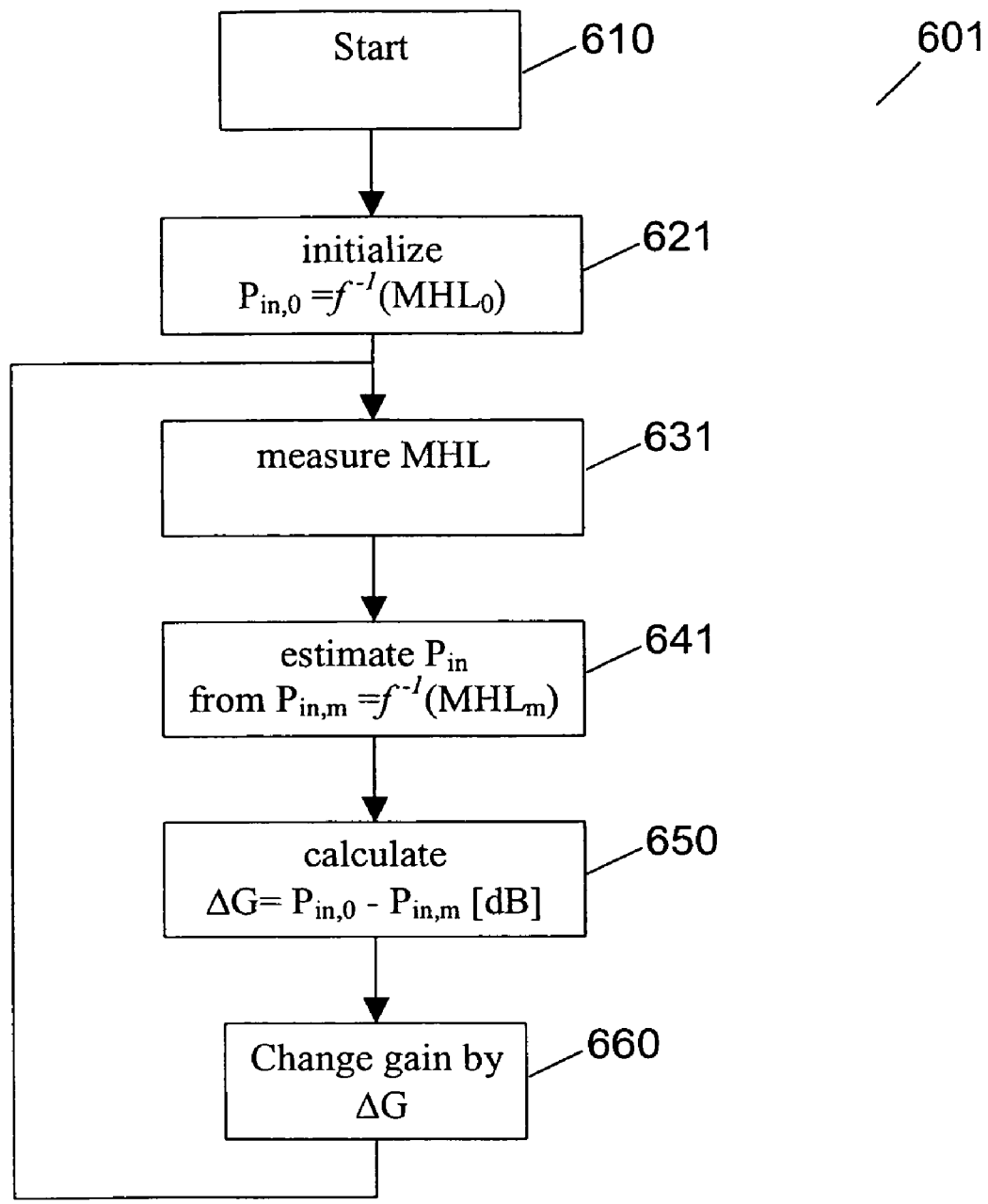
Figure 20:
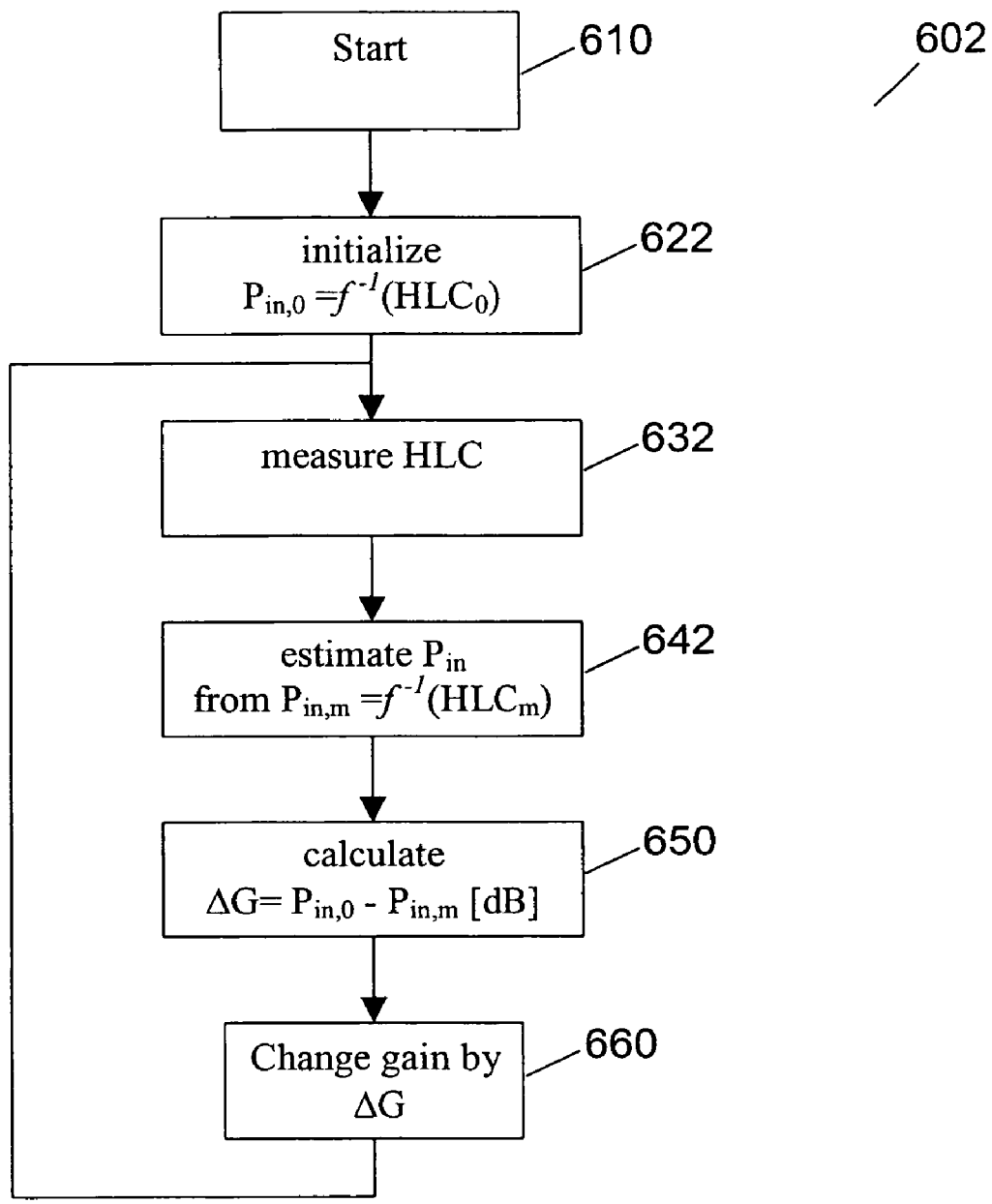

In FIG. 18 the RSR was used as the control signal $S_{AGC,control}$. Corresponding flow charts in which the measures MHL and HLC, respectively, are used as the control signal $S_{AGC,control}$ are shown in FIGS. 19 and 20. In the flow chart 601 of FIG. 19 the steps 621, 631 and 641, in which the MHL is used, correspond to steps 620, 630 and 640 of FIG. 18, while the remaining steps are unchanged. Similarly, in the flow chart 602 of FIG. 20 the steps 622, 632 and 642, in which the HLC is used, correspond to steps 620, 630 and 640 of FIG. 18, while the remaining steps are unchanged.

It is noted that these schemes will only operate properly as long as these functions can be inverted. Therefore this does not apply entirely for RSR and MHL, as RSR and MHL for small input signals are zero and constant, respectively. Therefore, the simple flow charts outlined can be extended such that, whenever the Sigma-Delta converter operates in such a range where RSR and MHL cannot be mapped to a specific input signal level, the gain should be increased with a fixed amount such that the optimal signal strength for the Sigma-Delta converter can be reached within a specified amount of time. It is assumed that the optimal signal strength is located in a range where the inverse of RSR or MHL can be defined, for example, between −15 dB and −11 dB, see FIGS. 6 and 8.

It should be noted that a practical implementation of this scheme could be made more robust by including protection against erroneous gain values due to noise in the estimation of ΔG. Also, a maximum ΔG could be introduced which would further improve stability, in particular when the Sigma-Delta converter operates close to overload.

The two examples described above are only very simple optimisation schemes to find the solution for the nonlinear equations $RSR_m(G)-RSR_0=0$, $MHL_m(G)-MHL_0=0$, or $HLC_m(G)-HLC_0=0$, i.e. to find the gain G that satisfies the equation. For anyone skilled in the art of optimisation and/or control theory it is readily seen that different and/or more advanced methods can be applied to solve this equation based on requirements to speed, complexity, robustness, accuracy, and whether it should be implemented in the analogue or digital domain or combination of both.

It should be recognized that the examples described above and shown in the figures are based on an ideal second order Sigma-Delta converter and that other Sigma-Delta converter solutions with e.g. different order, architecture, low-pass or band-pass type, filter coefficient etc. will be possible, too. In case of such other solutions, the relation between RSR, MHL, and HLC to the input power may differ. Finally, errors introduced in a real implementation including delay in the ADC/DAC, non-linearities, mismatch between signals path, etc., may also affect relations between the quantities defined.

It is further noted that in the embodiments described above, one of the measures RSR, MHL, HLC or a combination thereof is used as a control signal indicating an operating condition of the Sigma-Delta converter, e.g. whether the Sigma-Delta converter is operating close to or above an upper limit of a stable operating range. However, these measures are only examples of signals giving such indication. Other measures generated from internal signals or the output signal of the Sigma-Delta converter may well be used for providing the same or equivalent information. As an example, the signal-to-noise ratio (SNR) of the output signal of the Sigma-Delta converter as shown in FIG. 2 may be detected and used as the control signal.

Although a preferred embodiment of the present invention has been described and shown, the invention is not restricted to it, but may also be embodied in other ways within the scope of the subject-matter defined in the following claims.

The invention claimed is:

1. A method of adjusting an input signal level of an analog-to-digital converter, comprising the steps of:
generating a control signal indicative of an input signal level to said analog-to-digital converter, said control signal being generated as a signal indicating whether said analog-to-digital converter is operating close to or above an upper limit of an operating range; and
adjusting the input signal level to said analog-to-digital converter in dependence of said control signal,
wherein said analog-to-digital converter is a Sigma-Delta converter, and said control signal is generated as a signal indicating whether said Sigma-Delta converter is operating close to or above an upper limit of a stable operating range, the step of generating the control signal further comprising the step of counting consecutive equal samples in an output signal from said Sigma-Delta converter.

2. A method according to claim 1, wherein the step of generating a control signal further comprises the steps of:
detecting a maximum number of consecutive equal samples in the output signal from said Sigma-Delta converter during a given measurement interval; and
providing said detected maximum number of consecutive equal samples as the control signal indicative of the input signal level to said Sigma-Delta converter.

3. A method according to claim 1, wherein the step of generating a control signal further comprises the steps of:
detecting a number of times a specific number of consecutive equal samples in the output signal from said Sigma-Delta converter is counted during a given measurement interval; and
providing said detected number of times as the control signal indicative of the input signal level to said Sigma-Delta converter.

4. A method according to claim 1, wherein the step of adjusting the input signal level to said Sigma-Delta converter comprises the steps of:
comparing said control signal with a reference value; and
adjusting a gain of a variable gain amplifier arranged upstream of said Sigma-Delta converter by a predefined change of gain, such that said gain is decreased by said predefined change of gain if said control signal exceeds said reference value and is otherwise increased by said predefined change of gain.

5. A method according to claim 1, wherein the step of adjusting the input signal level to said Sigma-Delta converter comprises the steps of:
calculating from said control signal a corresponding input signal level to said Sigma-Delta converter;
calculating a change of gain as a difference between said calculated corresponding input signal level and a predefined reference input signal level; and
adjusting a gain of a variable gain amplifier arranged upstream of said Sigma-Delta converter by said calculated change of gain.

6. A method according to claim 1, wherein said Sigma-Delta converter is a 1-bit Sigma-Delta converter.

7. An arrangement for performing analog-to-digital conversion, the arrangement comprising:
an analog-to-digital converter;
means for generating a control signal indicative of an input signal level to said analog-to-digital converter and indicating whether said analog-to-digital converter is operating close to or above an upper limit of an operating range; and
means for adjusting the input signal level to said analog-to-digital converter in dependence of said control signal,
wherein said analog-to-digital converter is a Sigma-Delta converter and the arrangement is adapted to generate said control signal as a signal indicating whether said Sigma-Delta converter is operating close to or above an upper limit of a stable operating range, and the means for generating a control signal further comprises means for counting consecutive equal samples in an output signal from said Sigma-Delta converter.

8. An arrangement according to claim 7, wherein the means for generating a control signal further comprises means for detecting a maximum number of consecutive equal samples in the output signal from said Sigma-Delta converter during a given measurement interval and providing said detected maximum number of consecutive equal samples as the control signal indicative of the input signal level to said Sigma-Delta converter.

9. An arrangement according to claim 7, wherein the means for generating a control signal further comprises means for detecting a number of times a specific number of consecutive equal samples in the output signal from said Sigma-Delta converter is counted during a given measurement interval and providing said detected number of times as the control signal indicative of the input signal level to said Sigma-Delta converter.

10. An arrangement according to claim 7, wherein the means for adjusting the input signal level to said Sigma-Delta converter is arranged to:
compare said control signal with a reference value; and
adjust a gain of a variable gain amplifier arranged upstream of said Sigma-Delta converter by a predefined change of gain, such that said gain is decreased by said predefined change of gain if said control signal exceeds said reference value and is otherwise increased by said predefined change of gain.

11. An arrangement according to claim 7, wherein the means for adjusting the input signal level to said Sigma-Delta converter is arranged to:
calculate from said control signal a corresponding input signal level to said Sigma-Delta converter;
calculate a change of gain as a difference between said calculated corresponding input signal level and a predefined reference input signal level; and
adjust a gain of a variable gain amplifier arranged upstream of said Sigma-Delta converter by said calculated change of gain.

12. An arrangement according to claim 7, wherein said Sigma-Delta converter is a 1-bit Sigma-Delta converter.

13. A wireless communications device comprising the arrangement for performing analog-to-digital conversion according to claim 7.

14. A device for generating a control signal indicative of an input signal level to an analog-to-digital converter wherein the device comprises processing means arranged to generate said control signal as a signal indicating whether said analog-to-digital converter is operating close or above an upper limit of an operating range; and wherein the device is adapted to provide said control signal to means for adjusting the input signal level to said analog-to-digital converter,
wherein the device is adapted to receive a signal from a Sigma-Delta converter and generate said control signal as a signal indicating whether said Sigma-Delta converter is operating close to or above an upper limit of a stable operating range, and the device further comprises means for counting consecutive equal samples in an output signal from said Sigma-Delta converter.

15. A device according to claim 14, wherein the device further comprises means for detecting a maximum number of consecutive equal samples in the output signal from said Sigma-Delta converter during a given measurement interval and providing said detected maximum number of consecutive equal samples as the control signal indicative of the input signal level to said Sigma-Delta converter.

16. A device according to claim 14, wherein the device further comprises means for detecting a number of times a specific number of consecutive equal samples in the output signal from said Sigma-Delta converter is counted during a given measurement interval and providing said detected number of times as the control signal indicative of the input signal level to said Sigma-Delta converter.

17. A computer readable medium having stored thereon program code means for performing a method of adjusting an input signal level of an analog-to-digital converter when said program code means is run on a computer, the method comprising the steps of:
generating a control signal indicative of an input signal level to said analog-to-digital converter, said control signal being generated as a signal indicating whether said analog-to-digital converter is operating close to or above an upper limit of an operating range; and
adjusting the input signal level to said analog-to-digital converter in dependence of said control signal,
wherein said analog-to-digital converter is a Sigma-Delta converter, and said control signal is generated as a signal indicating whether said Sigma-Delta converter is operating close to or above an upper limit of a stable operating range, the step of generating the control signal further comprising the step of counting consecutive equal samples in an output signal from said Sigma-Delta converter.

* * * * *

UNITED STATES PATENT AND TRADEMARK OFFICE
CERTIFICATE OF CORRECTION

PATENT NO. : 7,825,841 B2  Page 1 of 1
APPLICATION NO. : 12/096604
DATED : November 2, 2010
INVENTOR(S) : Sundstrom et al.

It is certified that error appears in the above-identified patent and that said Letters Patent is hereby corrected as shown below:

In Fig. 6, Sheet 3 of 12, delete "[100 SNI [dB]," and insert -- [100 SNR [dB] --, therefor.

Signed and Sealed this
Fourteenth Day of February, 2012

David J. Kappos
*Director of the United States Patent and Trademark Office*